United States Patent
Ni et al.

(10) Patent No.: US 11,160,147 B2
(45) Date of Patent: Oct. 26, 2021

(54) DIMMING CIRCUIT AND LIGHTING DEVICE

(71) Applicant: Wenzhou MTLC Electric Appliances Co., Ltd, Zhejiang (CN)

(72) Inventors: Lidong Ni, Zhejiang (CN); Wei Gao, Zhejiang (CN)

(73) Assignee: Wenzhou MTLC Electric Appliances Co., Ltd., Zhejiang (CN)

( * ) Notice: Subject to any disclaimer, the term of this patent is extended or adjusted under 35 U.S.C. 154(b) by 0 days.

(21) Appl. No.: 16/592,346

(22) Filed: Oct. 3, 2019

(65) Prior Publication Data

US 2020/0137849 A1 Apr. 30, 2020

(30) Foreign Application Priority Data

Oct. 30, 2018 (CN) .......................... 201811280553.1

(51) Int. Cl.
*H05B 39/04* (2006.01)
*H03K 17/16* (2006.01)

(52) U.S. Cl.
CPC ......... *H05B 39/047* (2013.01); *H03K 17/162* (2013.01)

(58) Field of Classification Search
None
See application file for complete search history.

(56) References Cited

U.S. PATENT DOCUMENTS

2016/0044754 A1* 2/2016 Xu .......................... H05B 45/48
315/186

FOREIGN PATENT DOCUMENTS

| CN | 202535583 U | * | 11/2012 |
| CN | 205491315 U | * | 8/2016 |
| JP | H07-031297 Y | * | 7/1995 |

OTHER PUBLICATIONS

Machine Translation of CN205491315U.*
Machine Translation of JP H07-031297Y.*
Machine Translation of CN202535583U.*

* cited by examiner

*Primary Examiner* — Alexander H Taningco
*Assistant Examiner* — Pedro C Fernandez
(74) *Attorney, Agent, or Firm* — Ziegler IP Law Group, LLC

(57) ABSTRACT

A dimming circuit and a lighting device includes a signal processing unit having a first controllable switch connected to a to-be-processed dimming signal, a first port of a controller, and a first voltage signal; the to-be-processed dimming signal and the first voltage signal controlling turning-on/off the first controllable switch, the to-be-processed dimming signal being converted into a second voltage signal, and outputted from the second terminal to the controller; and the controller, extracting a corresponding dimming control signal based on change of the second voltage signal, and outputting the dimming control signal to a to-be-dimmed terminal. This circuit converts a electrical signal implements dimming control in conjunction with the controller, and the controller only processes weak electrical signals, thereby guaranteeing the reliability of the output voltage of the dimming circuit, and preventing the output voltage of the dimming circuit from harming the to-be-dimmed terminal.

9 Claims, 4 Drawing Sheets

DIMMING CIRCUIT AND LIGHTING DEVICE

TECHNICAL FIELD

The aspects of the disclosed embodiments relate to the field of electronic circuit technology, and in particular to, a dimming circuit and a lighting device.

BACKGROUND

For the lighting field, at present, two types of dimmers are prevailing on the market: one is a thyristor-based phase-cut dimmer, and the other is a 0-10V dimmer. The thyristor-based phase-cut dimmer cuts a portion of a sine wave voltage inputted from an alternating current power system by controlling a conduction angle of a thyristor rectifier based on the working principle of thyristor phase control, to reduce the average output voltage, thereby controlling the supply voltage of the lighting circuit, and achieving the dimming function of the lighting load. A dimming controller controls a driver of a lighting device by outputting a PWM signal or a 0-10V analog signal. The driver of the lighting device outputs currents of different levels to a light source of the lighting device in accordance with a dimming signal, so that the lighting device produces different luminance.

Due to the advantages of small volume, reasonable price, and wide dimming power range, the thyristor phase control (wave chopping process) dimming method is the most widely used dimming method at present, and is widely used in the field of stage lighting and ambient lighting.

However, the thyristor phase control dimming method works by wave chopping, outputs a voltage which will have a large number of harmonic waves, thereby forming harmonic pollution on the power system, and tending to cause great harm to the lighting device using the dimming circuit.

SUMMARY

In view of this, embodiments of the aspects of the disclosed embodiments provide a dimming circuit and a lighting device, to solve the problem of the output voltage of the dimming circuit doing harm to a to-be-dimmed terminal.

According to a first aspect, an embodiment of the aspects of the disclosed embodiments provides a dimming circuit, including:

a signal processing unit, having a first controllable switch; the first controllable switch having a first terminal connected to a to-be-processed dimming signal MltCon, a second terminal connected to a first port of a controller, and a third terminal connected to a first voltage signal; the to-be-processed dimming signal MltCon and the first voltage signal controlling turning-on and turning-off of the first controllable switch, the to-be-processed dimming signal MltCon being converted into a second voltage signal MltConIn, and outputted from the second terminal to the first port of the controller; and the controller, extracting a corresponding dimming control signal based on change of the second voltage signal MltConIn, and outputting the dimming control signal to a to-be-dimmed terminal.

The dimming circuit according to the aspects of the disclosed embodiments converts the to-be-processed dimming signal MltCon with the signal processing unit into the second voltage signal MltConIn suitable for the controller to work, and then implements dimming control on the to-be-dimmed terminal with the controller; and the circuit converts an electrical signal of a high voltage of strong electricity into a stable electrical signal of a low voltage of weak electricity, and then implements dimming control in conjunction with the controller, and the controller only processes weak electrical signals, thereby guaranteeing the reliability of the output voltage of the dimming circuit, and preventing the output voltage of the dimming circuit from harming the to-be-dimmed terminal.

In combination with the first aspect, in the first embodiment of the first aspect, the signal processing unit further includes:

a preprocessing circuit, connected to the second terminal of the first controllable switch, and configured to perform at least one of voltage regulation or filtering of the second voltage signal MltConIn; and a voltage dividing circuit, connected to the preprocessing circuit; the voltage dividing circuit connected to the first port of the controller.

The dimming circuit provided in the aspects of the disclosed embodiments preprocesses the second voltage signal MltConIn, and then performs voltage regulation or filtering with the first controllable switch, to ensure the stability of signals inputted into the first controllable switch, and lay the foundation for subsequent reliable conversion of the signals.

In combination with the first embodiment of the first aspect, in a second embodiment of the first aspect, the signal processing unit further includes:

a first diode, configured to rectify the to-be-processed dimming signal MltCon;

a first resistor, having one terminal connected to the first diode, and another terminal connected to the first terminal of the first controllable switch; and a second diode, having one terminal connected between the first diode and the first resistor, and another terminal connected to the third terminal of the first controllable switch.

In the dimming circuit provided in the aspects of the disclosed embodiments, the first controllable switch converts an alternating current signal inputted into the signal processing unit into a low-level direct current signal suitable for the controller to work, to facilitate subsequently outputting the dimming control signal based on the converted second voltage signal MltConIn by the controller.

In combination with the first aspect, in a third embodiment of the first aspect, the first controllable switch is a first triode, the first terminal is an emitting electrode of the first triode, the second terminal is a collecting electrode of the first triode, and the third terminal is a base electrode of the first triode.

In combination with the third embodiment of the first aspect, in a fourth embodiment of the first aspect, the base electrode of the first triode is grounded through a third resistor.

In combination with the first aspect or any one embodiment of the first aspect, a fifth embodiment of the first aspect further includes:

a plurality of switching circuits, each of the switching circuits having an input terminal connected to a power source, and an output terminal connected to an input terminal of the signal processing unit; and there being one-to-one correspondence between the switching circuits and the signal processing units; where the switching circuit is configured to provide the signal processing unit with the to-be-processed dimming signal MltCon.

By providing the plurality of switching circuits, the dimming circuit provided in the aspects of the disclosed embodiments can achieve multiplex control of the to-be-dimmed terminal, so that dimming control of the to-be-dimmed terminal can be implemented at different sites.

In combination with the fifth embodiment of the first aspect, in a sixth embodiment of the first aspect, the switching circuit includes:

a switch, connected between the power source and a fourth terminal of a second controllable switch; and the second controllable switch, having a fourth terminal, a fifth terminal, and a sixth terminal; where the fifth terminal is connected to a direct current power source through a pull-up resistor, and the sixth terminal is connected to the input terminal of the signal processing unit.

In combination with the sixth embodiment of the first aspect, in a seventh embodiment of the first aspect, the second controllable switch is a second triode, the fourth terminal is a base electrode of the second triode, the fifth terminal is a collecting electrode of the second triode, and the sixth terminal is an emitting electrode of the second triode.

In combination with the fifth embodiment of the first aspect, in an eighth embodiment of the first aspect, the controller stores a plurality of preset dimming control signals, there is one-to-one correspondence between the dimming control signals and the first ports; and the controller extracts a corresponding dimming control signal when determining that the second voltage signal MltConIn inputted from the first port is changed, and outputs the dimming control signal to the to-be-dimmed terminal.

The dimming circuit provided in the aspects of the disclosed embodiments converts output signals of switching circuits by signal processing units into direct current signals suitable for a controller to work, so that the controller can extract a corresponding dimming control signal from pre-stored a plurality of preset dimming control signals based on direct current signal change at each port, and output the dimming control signal to a to-be-dimmed terminal, to implement dimming control on the to-be-dimmed terminal.

According to a second aspect, the disclosed embodiments further provides a lighting device, including the dimming circuit in the first aspect, or any one embodiment of the first aspect.

The lighting device provided in the aspects of the disclosed embodiments converts a to-be-processed dimming signal MltCon using a signal processing unit into a second voltage signal MltConIn suitable for a controller to work, and then implements dimming control on a to-be-dimmed terminal using the controller; and the circuit converts an electrical signal of a high voltage of strong electricity into a stable electrical signal of a low voltage of weak electricity, and then implements dimming control in conjunction with the controller, and the controller only processes weak electrical signals, thereby guaranteeing the reliability of the output voltage of the dimming circuit, preventing the output voltage of the dimming circuit from harming the lighting device, and improving the service life of the lighting device.

BRIEF DESCRIPTION OF THE DRAWINGS

To more clearly describe the technical solutions of the aspects of the disclosed embodiments or the existing technologies, the accompany drawings to be used in the description of the specific embodiments or the existing technologies will be briefly introduced as follows. For those skilled in the art, other drawings may also be obtained according to these drawings without making inventive efforts.

DETAILED DESCRIPTION

To make the objectives, the technical solutions and the advantages of the aspects of the disclosed embodiments clearer, the technical solutions of the embodiments will be clearly and completely described below with reference to the accompanying drawings in the embodiments. Apparently, the embodiments described below are a part, instead of all, of the embodiments. Based on the aspects of the disclosed embodiments, all other embodiments obtained by those skilled in the art without making inventive efforts shall fall within the scope of protection of the aspects of the disclosed embodiments.

In the description of the aspects of the disclosed embodiments, it should be noted that the terms "first," "second," and "third" are used for illustrative purposes only, and should not be understood to indicate or imply relative importance.

In addition, the technical features involved in different embodiments of the aspects of the disclosed embodiments described below may be combined with each other without conflict.

Figure 1:
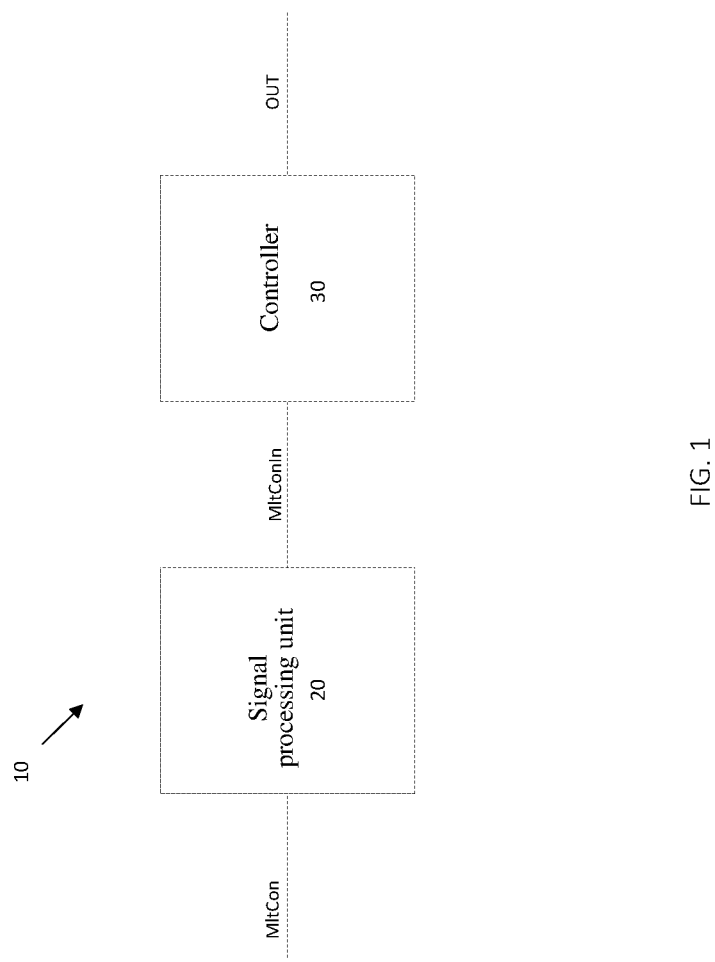
FIG. 1 is a structural schematic diagram of a dimming circuit according to an embodiment.

An embodiment provides a dimming circuit 10, as shown in FIG. 1. The circuit 10 includes: a signal processing unit 20 and a controller 30. A to-be-processed dimming signal MltCon is inputted into the signal processing unit 20, processed by the signal processing unit 20, and then converted into a second voltage signal MltConIn. The controller 30 extracts a corresponding dimming control signal OUT based on change of the second voltage signal MltConIn, and outputs the dimming control signal OUT to a to-be-dimmed terminal, to implement dimming control on the to-be-dimmed terminal.

Figure 2:
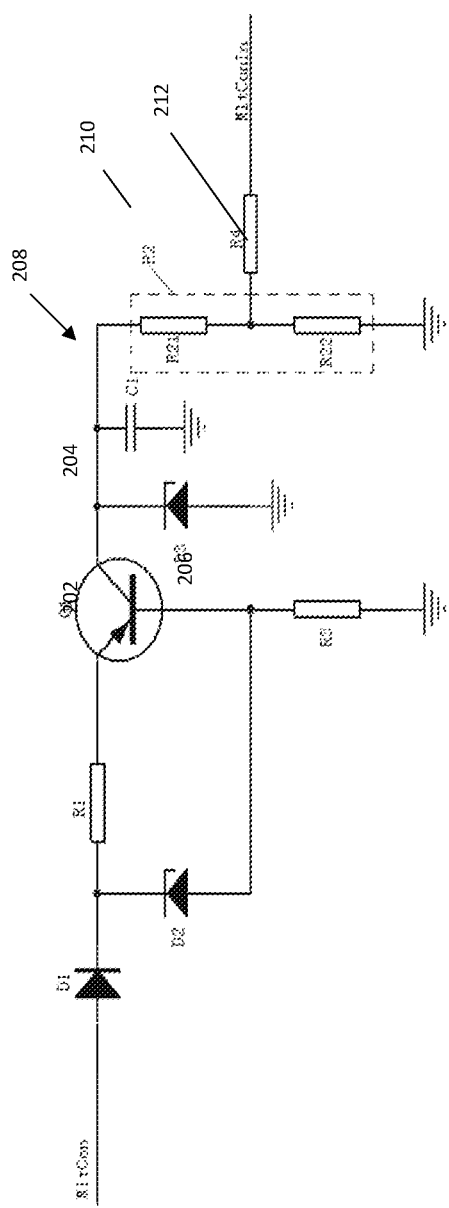
FIG. 2 is a structural schematic diagram of a signal processing unit according to an embodiment.

Specifically, referring also to FIG. 2, the signal processing unit 20 has a first controllable switch Q1. The first controllable switch Q1 has a first terminal 202, a second terminal 204, and a third terminal 206. The first terminal 202 is connected to the to-be-processed dimming signal MltCon, i.e., the first terminal 202 of the first controllable switch Q1 is used as an input terminal of the signal processing unit 30; the second terminal 204 is connected to a first port of the controller 30, i.e., the second terminal 204 of the first controllable switch Q1 is used as an output terminal of the signal processing unit 20; and the third terminal 206 is connected to a first voltage signal. The signal processing unit 20 converts the to-be-processed dimming signal MltCon into the second voltage signal MltConIn through turning-on and turning-off of the first controllable switch Q1.

Further, the control over the turning-on and turning-off of the first controllable switch Q1 is implemented through the to-be-processed dimming signal MltCon and the first voltage signal. For example, the turning-on and turning-off of the first controllable switch Q1 can be implemented based on voltage size relationship between the to-be-processed dimming signal MltCon and the first voltage signal; or implemented by other approaches, as long as the turning-on and turning-off of the first controllable switch Q1 is implemented under control of the to-be-processed dimming signal MltCon and the first voltage signal.

Further, since the turning-on and turning-off of the first controllable switch Q1 will cause a change of the second voltage signal MltConIn, the controller 30 can determine whether the to-be-processed dimming signal MltCon is changed at this time based on change of the second voltage signal MltConIn. Then, the controller 30 extracts a corresponding dimming control signal based on change of the second voltage signal MltConIn, and outputs the dimming control signal OUT to the to-be-dimmed terminal.

For example, the controller 30 pre-stores some dimming control signals. The controller 30 can determine whether the to-be-processed dimming signal MltCon is changed at this time based on change in size, or change in frequency, or other change amount of the second voltage signal MltConIn. After determining that the to-be-processed dimming signal MltCon is changed, the controller 30 extracts the corresponding dimming control signal, and outputs the dimming control signal OUT to the to-be-dimmed terminal.

The dimming circuit 10 provided in the present embodiment converts the to-be-processed dimming signal MltCon with the signal processing unit 20 into the second voltage signal MltConIn suitable for the controller 30 to work, and then implements dimming control on the to-be-dimmed terminal with the controller 30; and the circuit 10 converts an electrical signal of a high voltage of strong electricity into a stable electrical signal of a low voltage of weak electricity, and then implements dimming control in conjunction with the controller 30, and the controller 30 only processes weak electrical signals, thereby guaranteeing the reliability of the output voltage of the dimming circuit, and preventing the output voltage of the dimming circuit 10 from harming the to-be-dimmed terminal.

As an alternative implementation of the present embodiment, the first controllable switch Q1 may be a triode, or a transistor of other voltage control type, or the like, as long as the first controllable switch Q1 is capable of converting the to-be-processed dimming signal MltCon into a second voltage signal MltConIn suitable for the processor to work.

Alternatively, the signal processing unit 20 may also be provided with other functional circuits, such as filtering, rectifying, and voltage dividing, based on the actual situation.

Further alternatively, the controller 30 may be a single chip, or a WIFI module or other controller, as long as the controller 30 is capable of extracting the corresponding dimming control signal based on change of the second voltage signal MltConIn, and outputting the dimming control signal OUT to the to-be-dimmed terminal.

In some alternative implementations of the present embodiment, the dimming circuit 10 further includes a preprocessing circuit 208 and a voltage dividing circuit 210. Referring to FIG. 2, after preprocessing the second voltage signal MltConIn, the first controllable switch Q1 is configured for voltage regulation or filtering, to ensure the stability of signals inputted into the first controllable switch, and lay the foundation for subsequent reliable conversion of the signals.

The preprocessing circuit 208 is connected to the second terminal 204 of the first controllable switch Q1, and is configured to perform at least one of voltage regulation or filtering of the second voltage signal MltConIn. The second voltage signal MltConIn is processed by the preprocessing circuit 208, and then inputted into the first port of the controller.

In addition, the voltage dividing circuit 210 is connected to the preprocessing circuit 208, and is configured to perform voltage reduction on a signal outputted from the preprocessing circuit 208 and input the signal into the first port of the controller after voltage reduction. Alternatively, the voltage dividing circuit 210 may be a combination of series and parallel connections of a plurality of resistors.

As an alternative implementation of the present embodiment, as shown in FIG. 2, the preprocessing circuit 208 is configured to perform voltage regulation and filtering on the second voltage signal MltConIn outputted by the first controllable switch Q1. Specifically, the voltage regulation and filtering are implemented by a third diode D3 and a first capacitor C1 connected in parallel. The third diode D3 and the first capacitor C1 are connected between the second terminal 204 of a first controllable switch Q1 and the voltage dividing circuit 210.

Further alternatively, the voltage dividing circuit 210 is implemented through a resistor R2. The resistor R2 may be a resistor, or two resistors R21 and R22 shown in FIG. 2. An output terminal 212 of the signal processsing unit 20 is led out between the two resistors R21, R22 of the voltage dividing circuit 210. Preferably, the output terminal 212 led out between the two resistors R21, R22 of the voltage dividing circuit 210 is connected to a resistor R4 and then to the first port of the controller 30. The resistor R4 is configured to play a role in current limiting, and is configured to prevent a front-end spike voltage from impacting the first port of the controller 30.

In addition, as shown in FIG. 2, the signal processing unit 20 further includes a first diode D1, a first resistor R1, and a second diode D2.

The first diode D1 has an anode connected to a to-be-processed dimming signal MltCon, and a cathode connected to the first resistor R1 and then to the first terminal 202 of the first controllable switch Q1. The first resistor R1 has one terminal connected to the first diode D1, and another terminal connected to the first terminal 202 of the first controllable switch Q1, i.e., the first resistor R1 is connected between the cathode of the first diode D1 and the first terminal 202 of the first controllable switch Q1. The second diode D2 is configured to perform voltage regulation of the to-be-processed dimming signal MltCon, and has one terminal connected between the first diode D1 and the first resistor R1, and another terminal connected to a third terminal 206 of the first controllable switch Q1.

Alternatively, the first controllable switch Q1 is a first triode. The first terminal 202 of the first controllable switch Q1 is an emitting electrode of the first triode, the second terminal 204 of the first controllable switch Q1 is a collecting electrode of the first triode, and the third terminal 206 of the first controllable switch Q1 is a base electrode of the first triode.

The signal processing unit 20 has a high voltage protection function, and is configured to convert an inputted high-voltage to-be-processed dimming signal MltCon into a low-voltage direct current signal suitable for the controller 30 to work. The working principle of the signal processing unit 20 is as follows: when inputted into an input terminal of the signal processing unit 20, a to-be-processed dimming signal MltCon is rectified and outputted by the first diode D1. The second diode D2, the first triode Q1, the first resistor R1, and the third resistor R3 form a voltage limiting protection circuit to limit the output voltage of the emitting electrode 202 of the first triode Q1 within a permissible range. The third diode D3 plays a role in secondary voltage regulation and protection. The first capacitor C1 plays a role in filtering to a certain extent to filter out small clutter signals, such that the output waveform is stable. The resistors R21 and R22 form a voltage dividing circuit 210 to subdivide a voltage of the high-voltage weak electrical signal outputted from a front end to a low voltage, so that the low voltage is a weak electrical signal within an acceptable level range for the controller 30. The fourth resistor R4 plays a role in current limiting, and is configured to prevent the front-end spike voltage from impacting the first port of the controller 30. When the voltage of the to-be-processed dimming signal MltCon is different, the first triode Q1 will have two working states: turning-on and turning-off, so that an outputted second voltage signal MltConIn will also change. Then, the controller 30 determines whether it is necessary to extract a corresponding dimming control signal based on the second voltage signal MltConIn, and output the dimming control signal OUT to the to-be-dimmed terminal.

In some alternative embodiments of the aspects of the disclosed embodiments, the dimming circuit 10 further includes a plurality of switching circuits. The switching circuit is configured to provide the signal processing unit 20 with the to-be-processed dimming signal MltCon. Each of the switching circuits has an input terminal connected to a power source, and an output terminal connected to an input terminal of the signal processing unit 20. There is one-to-one correspondence between the switching circuits and the signal processing units 20. For example, the dimming circuit is provided with 3 switching circuits A, B, and C. Each of the switching circuits is connected to a signal processing unit. When the switching circuit A is turned on, luminance of the to-be-dimmed terminal is D1; when the switching circuit B is turned on, luminance of the to-be-dimmed terminal is D2; and when the switching circuit C is turned on, luminance of the to-be-dimmed terminal is D3. Each of the switching circuits is connected to a power source.

The output terminals of the signal processing units 20 are connected to different pins of the first port of the controller 30. By monitoring whether the electrical signal of each of the pins is changed, the controller 30 can determine a switching circuit being turned on currently. After determining the switching circuit being turned on currently, the controller 30 can extract a pre-stored dimming control signal corresponding to the switching circuit, and output the dimming control signal OUT to the to-be-dimmed terminal, to implement dimming control of the to-be-dimmed terminal.

Alternatively, the dimming control signal OUT corresponding to the switching circuit stored in the controller 20 may be a constant voltage, or a voltage changing in accordance with a preset rule, or the like.

Figure 3:
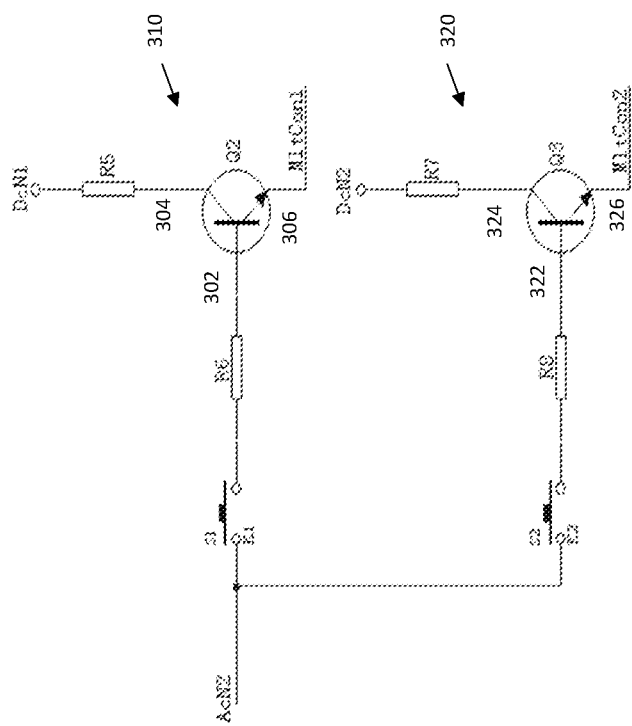
FIG. 3 is a structural block diagram of a switching circuit according to an embodiment.

As an alternative implementation of the present embodiment, FIG. 3 shows structures of 2 switching circuits 310, 320, one of which is described in detail as an example as follows: the switching circuit 310 includes a switch S1, and a second controllable switch Q2. The second controllable switch Q2 has a fourth terminal 302, a fifth terminal 304, and a sixth terminal 306. The fifth terminal 304 is connected to a direct current power source DcN1 through a pull-up resistor R5. The sixth terminal 306 outputs a to-be-processed dimming signal MltCon1, and is connected to an input terminal of a signal processing unit 10. In addition, the switch S1 is connected between a power source AcN2 and the fourth terminal 302 of the second controllable switch Q2.

In the example of FIG. 3 the switching circuit 320 includes a switch S2, and a controllable switch Q3. The controllable switch Q3 has a terminal 322, a terminal 324, and a terminal 326. The terminal 324 is connected to a direct current power source DcN2 through a pull-up resistor R7.

The terminal 326 outputs a to-be-processed dimming signal MltCon2, and is connected to an input terminal of a signal processing unit 20. In addition, the switch S2 is connected between a power source AcN2 and the terminal 322 of the controllable switch Q3.

By providing the plurality of switching circuits, multiplex control of the to-be-dimmed terminal can be implemented, so that dimming control of the to-be-dimmed terminal can be implemented at different sites. The specific number of switching circuits provided can be specifically set according to the actual situation, and is not defined here.

Alternatively, a resistor R6 is connected between the switch S1 and the second controllable switch Q2, and is configured to divide the voltage of the inputted power source AcN2. A resistor R8 is connected between the switch S2 and the controllable switch Q3, and is configured to divide the voltage of the inputted power source AcN2.

Further alternatively, the second controllable switch Q2 is a second triode. The fourth terminal 302 of the second controllable switch Q2 is a base electrode of the second triode, the fifth terminal 304 of the second controllable switch Q2 is a collecting electrode of the second triode, and the sixth terminal 306 of the second controllable switch Q2 is an emitting electrode of the second triode.

Figure 4:
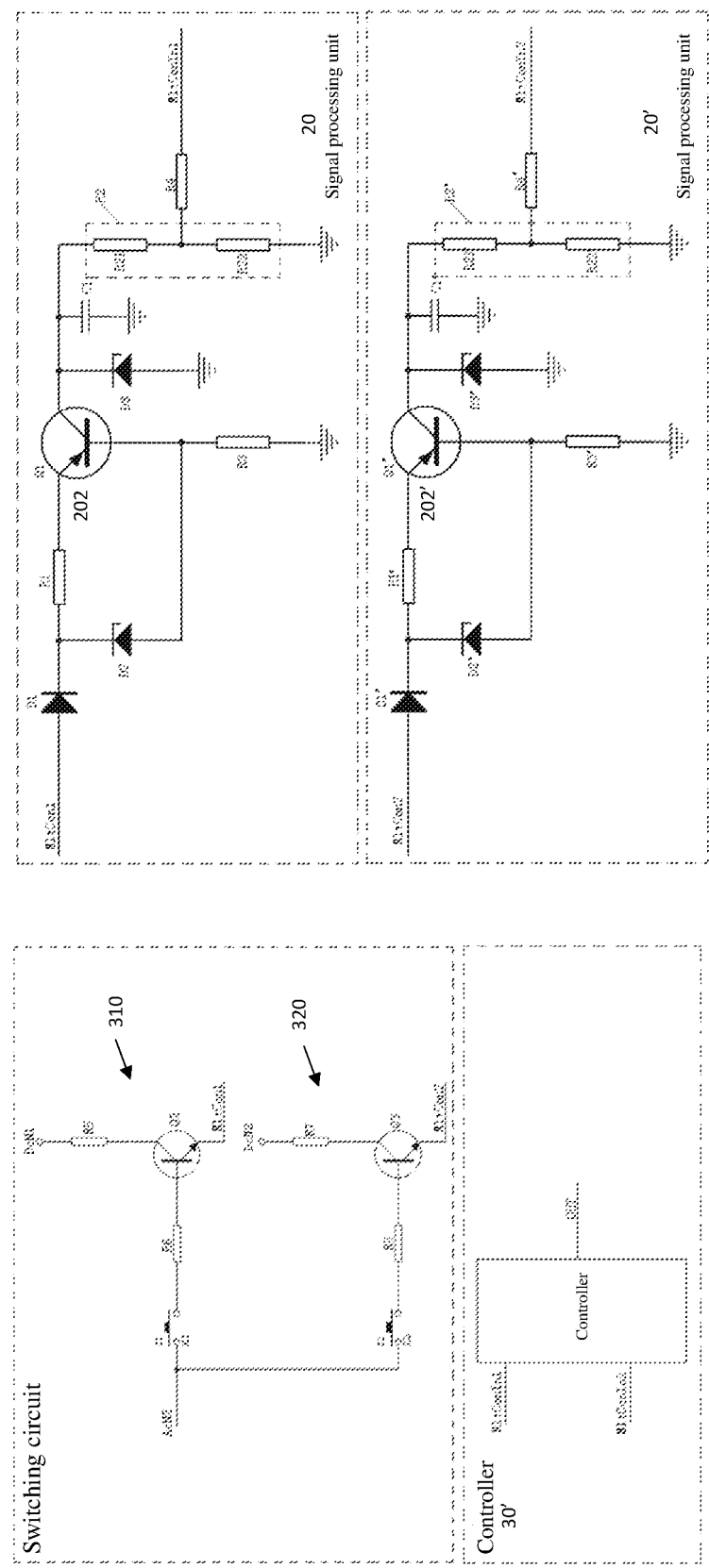
FIG. 4 is a structural schematic diagram of a dimming circuit according to an embodiment.

An embodiment further provides a dimming circuit 400, as shown in FIG. 4. The dimming circuit includes two switching circuits 310, 320. Each of the switching circuits 310, 320 corresponds to a respective signal processing unit 20, 20' and a controller 30'. The controller 30' stores two sets of preset dimming signals. The preset dimming signal is a voltage signal changing in accordance with a preset rule. For example, the switch S1 of switching circuit 310 corresponds to a preset dimming signal 1, and the switch S2 of switching circuit 320 corresponds to a preset dimming signal 2.

Specifically, during working, e.g., the AcN2 is connected to an N neutral line of an inputted alternating power source, when the switches S1 and S2 are not turned on, and the output voltage of MltConIn1 and MltConIn2 is 0V.

When the switch S1 is turned on, a trigger triode Q2 is turned on, so that the DcN1 is connected in series to a resistor R5, and then outputted to an MltCon1 terminal. A voltage at the MltCon1 terminal is rectified and outputted by the first diode D1. The second diode D2, the first triode Q1, the first resistor R1, and the third resistor R3 form a voltage limiting protection circuit to limit the output voltage of the emitting electrode 202 of the first triode Q1 within a permissible range. The third diode D3 plays a role in secondary voltage regulation and protection. The first capacitor C1 plays a role in filtering to a certain extent to filter out small clutter signals, such that the output waveform is stable. The resistors R21 and R22 form the voltage dividing circuit to subdivide the voltage of the high-voltage weak electrical signal outputted from the front end to a low voltage, so that the low voltage is a weak electrical signal within an acceptable level range for the controller. The fourth resistor R4 plays a role in current limiting, and is configured to prevent the front-end spike voltage from impacting the first port of the controller.

When the switch S2 is turned on, a trigger triode Q3 is turned on, so that the DcN2 is connected in series to a resistor R7, and then outputted to an MltCon2 terminal. A voltage at the MltCon2 terminal is rectified and outputted by a first diode D1'. A second diode D2', the first triode Q1', a first resistor R1', and a third resistor R3' form a voltage limiting protection circuit to limit the output voltage of the emitting electrode 202' of the first triode Q1' within a permissible range. A third diode D3' plays a role in secondary voltage regulation and protection. A first capacitor C1' plays a role in filtering to a certain extent to filter out small clutter signals, such that the output waveform is stable. Resistors R21' and R22' form a voltage dividing circuit to subdivide the voltage of the high-voltage weak electrical signal outputted from the front end to a low voltage, so that the low voltage is a weak electrical signal within an acceptable level range for the controller. A fourth resistor R4' plays a role in current limiting, and is configured to prevent the front-end spike voltage from impacting the first port of the controller.

In summary, when the switch S1 is turned off, the output voltage of the MltConIn1 is 0V; and when the switch S1 is turned on, the output voltage of the MltConIn1 is a low-level voltage. When the switch S2 is turned off, the output voltage of the MltConIn2 is 0V; and when the switch S2 is turned on, the output voltage of the MltConIn2 is a low-level voltage. Therefore, the controller 30' can specifically determine which of the switch S1 or the switch S2 have been operated based on voltage changes at different pins of the first port. After determining a particular operated switch, the controller 30' invokes a corresponding dimming control signal, and outputs the dimming control signal OUT to the to-be-dimmed terminal.

Specifically, the controller 30' stores a plurality of preset dimming control signals, and there is one-to-one correspondence between the dimming control signals and the first ports (i.e., one-to-one correspondence with the switches in the switching circuits). When determining that the second voltage signal MltConIn inputted from the first port is changed, the controller 30' extracts a corresponding dimming control signal, and outputs the dimming control signal OUT to the to-be-dimmed terminal, to cause the to-be-dimmed terminal to implement dimming control based on the dimming control signal.

As an alternative implementation of the present embodiment, an MltConIn signal processed by the front end is inputted into a port of the controller 30'. The controller 30' collects port voltage signals at a high frequency. The port signal is an approximately wave-like level signal. The controller 30' densely collects voltages at different time points, and then calculates an effective voltage for use as the basis for determining whether a double control function is triggered.

An embodiment further provides a lighting device. The lighting device includes the dimming circuit in the embodiments shown in FIG. 1 to FIG. 4. Please refer to the description of FIG. 1 to FIG. 4 for specific structural details of the dimming circuit. The description will not be repeated here.

While the embodiments of the aspects of the disclosed embodiments are described in conjunction with the accompanying drawings, those skilled in the art can make various modifications and variations without departing from the spirit and scope of the aspects of the disclosed embodiments. Such modifications and variations all fall within the scope as defined in the appended claims.

The invention claimed is:

1. A dimming circuit, comprising:
   a plurality of a least two switching circuits, the plurality of at least two switching circuits configured to provide a to-be-processed dimming signal, wherein a switching circuit of at least two switching circuits comprises a switch and a controllable switch, the switch being connected between a power source and a terminal of the controllable switch, the controllable switch configured to provide the to-be-processed dimming signal based on a state of the switch;
   a signal processing unit corresponding to each of the plurality of at least two switching circuits, the signal processing unit having a first controllable switch; the first controllable switch having a first terminal configured to receive the to-be-processed dimming signal from a corresponding one of the plurality of at least two switching circuits, a second terminal connected to a first port of a controller, and a third terminal connected to a first voltage signal;
   the to-be-processed dimming signal and the first voltage signal controlling turning-on and turning-off of the first controllable switch,
   the to-be-processed dimming signal being converted into a second voltage signal, and outputted from the second terminal to the first port of the controller; and
   the controller, extracting a corresponding dimming control signal from a stored set of preset dimming signals based on a change of the second voltage signal, and outputting the extracted dimming control signal to a to-be-dimmed terminal, wherein each switch of the plurality of at least two switching circuits corresponds to a different preset dimming signals.

2. The dimming circuit according to claim 1, wherein the signal processing unit further comprises:
   a preprocessing circuit connected to the second terminal of the first controllable switch, and configured to perform at least one of voltage regulation or filtering of the second voltage signal; and
   a voltage dividing circuit connected to the preprocessing circuit; the voltage dividing circuit being connected to the first port of the controller.

3. The dimming circuit according to claim 2, wherein the signal processing unit further comprises:
   a first diode, configured to rectify the to-be-processed dimming signal;
   a first resistor, having one terminal connected to the first diode, and another terminal connected to the first terminal of the first controllable switch; and
   a second diode, having one terminal connected between the first diode and the first resistor, and another terminal connected to the third terminal of the first controllable switch.

4. The dimming circuit according to claim 1, wherein the first controllable switch is a first triode, the first terminal is an emitting electrode of the first triode, the second terminal is a collecting electrode of the first triode, and the third terminal is a base electrode of the first triode.

5. The dimming circuit according to claim 4, wherein the base electrode of the first triode is grounded through a third resistor.

6. The dimming circuit according to claim 1, wherein the plurality of at least two switching circuits further comprises:
   a switch, connected between the power source and a fourth terminal of a second controllable switch; and
   the second controllable switch, having a fourth terminal, a fifth terminal, and a sixth terminal; wherein the fifth terminal is connected to a direct current power source through a pull-up resistor, and the sixth terminal is connected to the input terminal of the signal processing unit.

7. The dimming circuit according to claim 6, wherein the second controllable switch is a second triode, the fourth terminal is a base electrode of the second triode, the fifth terminal is a collecting electrode of the second triode, and the sixth terminal is an emitting electrode of the second triode.

8. The dimming circuit according to claim 1, wherein the controller is configured to store a plurality of preset dimming control signals, there is one-to-one correspondence between the stored plurality of preset dimming control signals and the first ports; and the controller is configured to extract the corresponding dimming control signal when determining that the second voltage signal inputted from the first port is changed.

9. A lighting device, comprising the dimming circuit according to claim 1.

* * * * *